(12) United States Patent
Kimura et al.

(10) Patent No.: US 6,924,012 B2
(45) Date of Patent: Aug. 2, 2005

(54) PYROLYTIC BORON NITRIDE DOUBLE CONTAINER AND MANUFACTURE THEREOF

(75) Inventors: Noboru Kimura, Gunma-ken (JP); Kenji Satoh, Gunma-ken (JP); Masaki Seki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 7 days.

(21) Appl. No.: 09/780,355

(22) Filed: Feb. 12, 2001

(65) Prior Publication Data

US 2001/0019750 A1 Sep. 6, 2001

(30) Foreign Application Priority Data

Feb. 17, 2000 (JP) ........................................ 2000-039389

(51) Int. Cl.⁷ ................................................. B32B 1/02
(52) U.S. Cl. .................... 428/34.4; 428/35.5; 428/34.6; 428/34.7
(58) Field of Search ............................ 428/34.4, 34.5, 428/34.6, 34.7

(56) References Cited

U.S. PATENT DOCUMENTS

| | | | |
|---|---|---|---|
| 3,986,822 A | 10/1976 | Lashway | 432/264 |
| 4,058,579 A | 11/1977 | Lashway | 764/81 |
| 5,674,317 A * | 10/1997 | Kimura et al. | 117/208 |
| 5,925,429 A * | 7/1999 | Kimura et al. | 428/34.5 |

FOREIGN PATENT DOCUMENTS

| | | |
|---|---|---|
| EP | 0 206 120 A1 | 12/1986 |
| EP | 0 842 913 A1 | 5/1998 |

\* cited by examiner

*Primary Examiner*—Harold Pyon
*Assistant Examiner*—Marc Patterson
(74) *Attorney, Agent, or Firm*—Oliff & Berridge, PLC

(57) ABSTRACT

A pyrolytic boron nirtride double container for a source of molecular beams used in molecular beam epitaxy, wherein the transmissivity of an inner container of the pyrolytic boron nitride double container with respect to light having a wave number of 2600 cm$^{-1}$ to 6500 cm$^{-1}$ is 90% or less of that of an outer container. The pyrolytic boron nitride double container, which enables molecular beams to generate stably with good temperature controllability and high heat efficiency and which can be used in a stable manner, is provided through a simple process and at low cost, so that molecular beam epitaxial growth can be stabilized, quality of the epitaxial film can be improved, and even though the rise and drop in the temperature of the material melt is repeated, or even at an emergency suspension of the operation, the trouble due to breakage of the container can be prevented.

25 Claims, 2 Drawing Sheets

PYROLYTIC BORON NITRIDE DOUBLE CONTAINER AND MANUFACTURE THEREOF

BACKGROUND OF THE INVENTION

1. Field of the Invention

The present invention relates to a pyrolytic boron nitride double container suitable for containing a material serving as a source of molecular beams used in molecular beam epitaxy (hereinafter abbreviated as "MBE").

2. Description of the Related Art

MBE is one method of manufacturing thin film, in which a thin-film growth chamber is maintained at ultra-low vacuum of $10^{-6}$–$10^{-11}$ Torr; a container that contains a material serving as a molecular beam source is heated to, for example, a temperature of 500–1500° C.; and molecular beams generated from the melt material are caused to impinge onto a heated substrate, so that a layer having a thickness corresponding to a few atoms is formed on the substrate in a controlled manner. Especially, the MBE method has been widely used for manufacture of epitaxial film of compound semiconductors such as GaAs, and from the viewpoints of purity, heat resistance, strength, and the like, a pyrolytic boron nitride (PBN) container made through chemical vapor deposition (hereinafter abbreviated as "CVD") has been widely used as a container for containing a material serving as the molecular beam source.

Conventionally, in such an MBE method, the temperature of a material is increased to generate molecular beams of the material. Then, after an epi-layer is grown, on-off control action of the beam is performed with shutter when the operation is suspended for a short time. Meanwhile in case of the suspension for many hours the temperature of the material is lowered, and in an emergency such as electric power failure it is lowered as well. And when the operation is restarted, the temperature of the material is increased again.

At this time, the rise and drop in the temperature of the material metal causes its expansion, shrinkage, solidification expansion, or solidification shrinkage to thereby generate a stress in the container, with the result that the container may break. If the material melt leaks out of the container, the material melt adheres to a heater, other heating members, and members inside a furnace, resulting in corrosion, degradation, and/or breakage of these components and members; and/or short-circuit of the heater.

In order to prevent such breakage of the container, there has been proposed a pyrolytic boron nitride container composed of double or multiple layers which are connected to each other with low bond strength. In this method, the container has a resistance to the shrinkage of the material melt, however when the material expands largely, this method has been ineffective frequently.

In order to solve the above-described problems, there has been conceived a double container which has some amount of space between the inner container and the outer container. However, in this case, some drawbacks are likely to occur, for example, heat conduction and heat efficiency for heating the inner container are not good, the temperature is unstable, and so forth.

SUMMARY OF THE INVENTION

The present invention has been accomplished in view of the foregoing problems. A main object of the present invention is to provide a pyrolytic boron nitride double container through a simple process and at low cost, which enables molecular beams to generate stably and has good temperature controllability and high heat efficiency and which can be used in a stable manner, so that molecular beam epitaxial growth can be stabilized, and quality of the epitaxial film can be improved, and even though the rise and drop in the temperature is repeated, or even at an emergency suspension of the operation, the trouble due to breakage of the container can be prevented.

In order to achieve the above object, the present invention provides a pyrolytic boron nitride double container for a source of molecular beams used in molecular beam epitaxy, wherein the transmissivity of an inner container of the pyrolytic boron nitride double container with respect to light having a wave number of 2600 $cm^{-1}$ to 6500 $cm^{-1}$ is 90% or less of that of an outer container.

As a result of setting the IR transmissivity of the inner container of the pyrolytic boron nitride double container for a source of molecular beams used in molecular beam epitaxy to 90% or less of that of an outer container, the inner container of the double container absorbs more radiant heat from the outside than the outer container, so that the inner container can be heated efficiently. The IR transmissivity of the inner container is preferablely set to 70% or less of that of the outer container.

Thus, the pyrolytic boron nitride double container which has good temperature controllability and high heat efficiency and which can be used in a stable manner is provided, so that even though the rise and drop in the temperature of the material melt is repeated, or even at an emergency suspension of the operation, the trouble due to breakage of the container can be prevented.

If the IR transmissivity of the inner container of the double container exceeds 90% of that of the outer container, the radiant heat is likely to be absorbed into the outer container and thus it becomes impossible to increase the temperature of the inner container sufficiently. As a result, the temperature control becomes unstable, which causes deterioration of quality of the epitaxial film.

In the present invention, in order to set the transmissivity of the inner container of the pyrolytic boron nitride double container with respect to light having a wave number of 2600 $cm^{-1}$ to 6500 $cm^{-1}$ to 90% or less of that of the outer container, the surface roughness of the outer surface of the inner container is preferably roughened, so that the transmissivity of the inner container can be 90% or less of that of the outer container.

The present invention also provides a method of manufacturing a pyrolytic boron nitride double container for a source of molecular beams used in molecular beam epitaxy, wherein an inner container and an outer container of the pyrolytic boron nitride double container are formed by a CVD reaction, the outer surface of the formed inner container is roughened to thereby adjust the amount of light scattered at the outer surface, such that the transmissivity of the inner container with respect to light having a wave number of 2600 $cm^{-1}$ to 6500 $cm^{-1}$ is set to 90% or less of that of the outer container.

As described above, the pyrolytic boron nitride double container wherein the IR transmissivity of the inner container is 90% or less of that of the outer container can be manufactured by roughening the outer surface of the inner container to scatter radiant light at the outer surface.

Next, in the present invention, an element except nitrogen and boron can be doped into the inner container of the pyrolytic boron nitride double container to form a doped layer, while at least one of the thickness, area, and doping density of the doped layer is adjusted, so that the transmissivity of the inner container can be set to 90% or less of that of the outer container.

The present invention also provides a method of manufacturing a pyrolytic boron nitride double container for a source of molecular beams used in molecular beam epitaxy, in which pyrolytic boron nitride is deposited on a graphite mandrel by a CVD reaction in order to form the double container, and the double container is then separated from the mandrel, wherein a dopant gas is introduced during the CVD reaction of the inner container in order to form a doped layer in the pyrolytic boron nitride container, and at least one of the thickness, area and the doping density of the doped layer is adjusted so as to set the transmissivity of the inner container with respect to light having a wave number of $2600\ cm^{-1}$ to $6500\ cm^{-1}$ to 90% or less of that of the outer container.

As described above, the pyrolytic boron nitride double container wherein the IR transmissivity of the inner container is 90% or less of that of the outer container can also be manufactured through a doping process in which a dopant gas is introduced into a furnace during the CVD reaction in order to form a doped layer in the pyrolytic boron nitride container, and at least one of the thickness, area and the doping density of the doped layer is adjusted.

In this case as well, the IR transmissivity of the inner container can be set to 90% or less of that of the outer container by changing the physical properties of the pyrolytic boron nitride.

Further, pyrolytic boron nitride of the inner container may be combined with other materials such as PG (pyrolytic graphite). In this case, since there is an outer container outside the inner container, the double container has an advantage that the problems such as contamination due to impurities or short circuit of a heater portion hardly occur.

In this case, if the element is doped such that the doped layer is exposed on neither inner surface nor outer surface of the inner container of the pyrolytic boron nitride double container, a fear that the material melt is contaminated by the dopant comes to diminish.

In order to prevent the doped layer from being exposed, a dopant gas may be introduced into a furnace at the middle of the CVD reaction during manufacture of the container, which can be performed very easily.

The elements to be doped into pyrolytic boron nitride are preferably one or more elements selected from Si, C, and Al.

These elements have a high absorption coefficient with respect to infrared rays (IR), and can be doped easily. However, the dopant element usable in the present invention is not limited thereto.

In the present invention, the thickness of the inner container of the pyrolytic boron nitride double container may be increased so that the transmissivity of the inner container is 90% or less of that of the outer container.

As described above, the thickness of the inner container is increased more than that of the outer container, and thereby the pyrolytic boron nitride double container wherein the transmissivity of the inner container is 90% or less of that of the outer container can be obtained.

The present invention also provides the pyrolytic boron nitride double container wherein the transmissivity of the inner container has a profile such that the transmissivity changes in the height direction of the inner container.

As a result of imparting such a profile to the IR transmissivity of the inner container, the temperature distribution within the inner container can be controlled into a desired distribution. Accordingly, it is possible to effectively prevent rising of material melt along the inner wall surface and adhesion of material melt to the upper portion of the inner container.

In this case, the transmissivity of the inner container of the pyrolytic boron nitride double container may be set low or high at the opening portion of the inner container.

As described above, as a result of imparting a profile such that the IR transmissivity of the inner container decreases at the opening portion, the temperature of the upper portion of the inner container is maintained high, so that adhesion of material melt to the upper portion and rising of the material melt thereto can be suppressed. Also, since the wettability with pyrolytic boron nitride varies with the kind of material melt, there is a case where the rising phenomenon can be suppressed through reduction of the temperature of the upper portion of the inner container. In such a case, the IR transmissivity of the inner container at the opening portion may be set high.

The present invention is effective especially in a case where there is a gap between the inner container and the outer container of the pyrolytic boron nitride double container.

Conventionally, in such a double container having a gap between the inner container and the outer container, there have been problems that heat conduction and heat efficiency for heating the inner container is not good, the temperature is unstable, and so forth. However, by means of the present invention, these problems can be solved.

In this case, the gap between the inner container and the outer container is preferably set to 0.2 to 30 mm.

If this gap is less than 0.2 mm, for example, when the inner container breaks, the outer container may break simultaneously.

If this gap is more than 30 mm, since the gap is too large, the size of the inner container becomes small. As a result, the volume of a material decreases, so that the material melt may run out in a short period of time. In a case where the material melt runs out, it needs to stop epitaxial growth in order to recharge the material or change the container. That is, when the volume of the material is small, the time to perform epitaxial growth continuously becomes short and there occurs drawback that maintenance such as recharging must be done frequently.

Accordingly, if the gap between the inner container and the outer container is 0.2 to 30 mm, even though the inner container breaks, the outer container does not herewith, and it is possible to provide the pyrolytic boron nitride double container which has high heat efficiency and can be used in a stable manner.

The present invention provides a pyrolytic boron nitride double container for a source of molecular beams used in molecular beam epitaxy, wherein the transmissivity of the inner container of the double container with respect to light having a wave number of $2600\ cm^{-1}$ to $6500\ cm^{-1}$ is set to 90% or less of that of the outer container. As a result, the molecular beams can be generated stably with good temperature controllability and high heat efficiency, and it is possible to use the double container in a stable manner. Besides the electric power consumption can be decreased, resulting in reducing the cost.

Accordingly, a pyrolytic boron nitride double container which enables molecular beams to stabilize for a long time is provided through a simple process and at low cost, so that molecular beam epitaxial growth can be stabilized, the quality of epitaxial film can be improved, and even at an emergency suspension of the operation, the trouble due to breakage of the container can be prevented. If epitaxial film is formed by using this double container according to an MBE method, epitaxial film having a few surface defects, i.e., good quality can be grown over long period.

DESCRIPTION OF THE PREFERRED EMBODIMENTS

Embodiments of the present invention will be described in detail hereinbelow, but the present invention is not limited to them.

In order to stabilize the generation of molecular beams in a crucible according to the MBE method, the inventors of the present invention have contrived a pyrolytic boron nitride double container, wherein the inner container of the double container has higher absorption coefficient with respect to IR than that of the outer container, so that the double container has good temperature controllability and high heat efficiency, and can be used in a stable manner. In this case, the inventors have found that it is effective that the transmissivity of the inner container with respect to the radiant light of the pyrolytic boron nitride double container itself is set to 90% or less of that of the outer container. The present invention was accomplished based on this finding.

Figure 1:
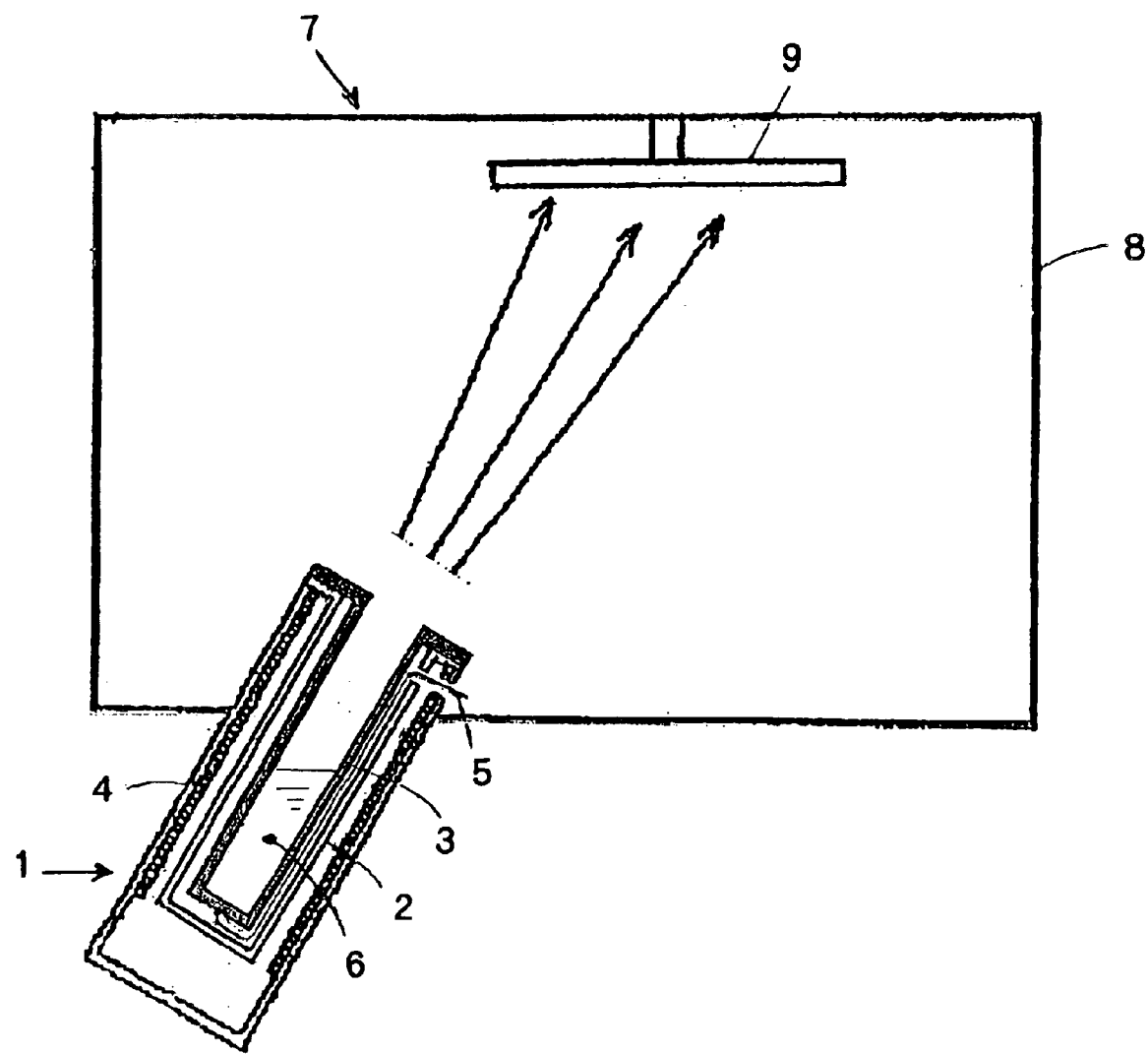
FIG. 1 is an explanatory view of a method of growing an MBE by using an apparatus for generating molecular beam equipped with a double container according to the present invention.

With reference to FIG. 1, there will be explained a method of growing an MBE by using an apparatus for generating molecular beam equipped with a double container according to the present invention.

An MBE growth system 7 comprises a wafer 9 set in a chamber 8 and an apparatus 1 for generating molecular beam. The molecular beam generating apparatus 1 has a double container which comprises a PBN inner container 3 and a PBN outer container 2 according to the present invention. A molecular beam material 6 in the inner container 3 is heated by a heater 4 to generate molecular beams. The molecular beams are emitted from the inner container 3 to the wafer 9, so that epitaxial film is deposited and grown on the surface of the wafer. The temperature of the molecular beam material 6 is measured with a thermocouple 5 and controlled.

The inner container 3 according to the present invention is employed so as to provide a pyrolytic boron nitride double container through a simple process and at low cost, which enables molecular beams to generate stably with good temperature controllability and high heat efficiency and which can be used in a stable manner, so that molecular beam epitaxial growth can be stabilized, the quality of epitaxial film can be improved, and even though the rise and drop in the temperature is repeated, or even at an emergency suspension of the operation, the trouble due to breakage of the container can be prevented.

That is, if the IR transmissivity of the inner container of the pyrolytic boron nitride double container is set to 90% or less of that of the outer container, problems caused in the aforementioned conventional double container such as a decrease in heat efficiency or an unstable controllability of temperature can be solved.

First, the inventors of the present invention performed studies on the wave number of radiant light to be a problem for a double container used in the MBE method. According to the MBE method, the temperature used for generating beams ranges from about 500 to 1600° C. The maximum energy-transfer wavelength λmax at this time is represented by Expression (1):

$$\lambda max = 2,898(\mu m \cdot K)/T, \quad (1)$$

where T is the temperatures in degrees Kelvin.

When λmax is calculated from Expression (1) with regard to the above-described temperature range and then the calculated values are converted into wave numbers, there are obtained a wave-number range of 2600 $cm^{-1}$ to 6500 $cm^{-1}$. Consequently, by decreasing the transmissivity with respect to light ranging from 2600 $cm^{-1}$ to 6500 $cm^{-1}$ and increasing the absorption with respect to same, it becomes possible to increase the absorption of heat in the inner container of the double container.

For example, if a resistance-heating type heating unit, such as a tantalum heater, arranged around a container for containing a material serving as the molecular beam source is employed as a heat source, heat is supplied from the outside of the double container in the form of radiant heat. If radiant heat is absorbed into a pyrolytic boron nitride outer container that constitutes the double container, only the outer container is heated, and the temperature of the inner container decreases.

When the transmissivity of the inner container of the pyrolytic boron nitride double container with respect to light having a wave number of 2600 $cm^{-1}$ to 6500 $cm^{-1}$ is set to 90% or less of that of the outer container, the temperature of the inner container can be maintained high so as to heat the material efficiently.

The inventors have developed three methods for setting the transmissivity of the inner container itself of the pyrolytic boron nitride double container used in the MBE method, with respect to light having a wave number of 2600 $cm^{-1}$ to 6500 $cm^{-1}$, to being 90% or less of that of the outer container.

Namely, (1) a method of changing the degree of scattering of light by changing the roughness of the outer surface of the PBN inner container; (2) a method of doping elements into the PBN while changing the thickness, area, doping density of the doped layer; and (3) a method of increasing the thickness of the inner container more than that of the outer container.

These methods will be described below in more detail.

(1) Method of Changing the Degree of Scattering of Light by Changing the Roughness of the Outer Surface of Inner container of PBN double container:

The transmissivity and absorptivity of the PBN double container with respect to light having a wave number of 2600 $cm^{-1}$ to 6500 $cm^{-1}$ can be changed by controlling the state of the surface of pyrolytic boron nitride, or the surface roughness of pyrolytic boron nitride. By controlling the surface roughness, the transmissivity can be changed, for example, when the outer surface of the pyrolytic boron nitride inner container is sanded with #320 paper, the transmissivity becomes low.

In this case, through adjustment of the roughness of the outer surface of the inner container, the transmissivity can be freely controlled. Besides, the roughness is changed at the opening portion and the bottom portion of the container, and thereby it becomes easy to impart a profile to the transmissivity.

(2) Method of Doping Elements into PBN:

When pyrolytic boron nitride is deposited by CVD, a dopant gas is introduced in order to dope desired elements into PBN. This method makes it possible to decrease the transmissivity of the inner container simply and reliably.

In this case, any kind of element may be doped, insofar as the element can change the IR transmissivity of PBN. However, in terms of easiness of doping process with dopant gas, one or more elements selected from Si, C, and Al are used.

When a gas containing a dopant element such as $SiCl_4$, $CH_4$, or $Al(CH_3)_3$ is introduced as a dopant gas during the deposition of PBN on the mandrel through CVD, so that a doped layer where the dopant element is doped in the PBN is formed.

The doped layer can be formed on the whole surface of the inner container of the PBN double container, or at any location on a part of the inner container. For example, such a doped layer may be formed on the outer surface of the inner container of the double container. However, if the doped layer is formed on the outer surface, the doped layer may contaminate a material melt accommodated in the double container for a source of molecular beams. In such a case, the doped layer is preferably formed such that it is not exposed on the outer surface of the inner container. Generally, the doped layer is formed on the outer surface of the inner container, or if the doped layer is formed within PBN layer, the doped layer is exposed on neither inner surface nor outer surface of the double container, and therefore there is no fear that the material melt is contaminated by these doped elements. In order to prevent the doped layer from being exposed, a dopant gas may be introduced into a furnace at the middle of the CVD reaction, so that the doped layer is formed in the middle of PBN layer.

Through adjustment of the thickness, area, or doping density of the doped layer, the transmissivity of the PBN double container with respect to light having a wave number of 2600 $cm^{-1}$ to 6500 $cm^{-1}$ can be freely controlled.

The thickness of the doped layer can be controlled, for example, through adjustment of the time over which the dopant gas is introduced during the CVD reaction. The doping density can be controlled simply through adjustment of the concentration of the dopant gas contained in the gas to be introduced. A profile can be imparted to the thickness of the doped layer or the doping area through a simple operation such as mechanical abrasion of the doped layer after completion of the doping reaction. Accordingly, the container having a profile such that the transmissivity changes in the height direction of the container can be manufactured easily.

(3) Method of Increasing Thickness of Inner Container More than that of Outer Container:

Thickness of the inner container and the outer container of the PBN double container can be changed by changing the time over which a PBN is grown, machining the container after the PBN is grown, or the like. Accordingly, a CVD reaction time to form the inner container is made longer, and thereby the transmissivity of the inner container can be simply set to 90% or less of that of the outer container. In order to impart a profile to the transmissivity in the height direction of the container, the container may be machined to change its thickness.

EXAMPLES

Next, examples and a comparative example of the present invention will be explained.

Figure 2:
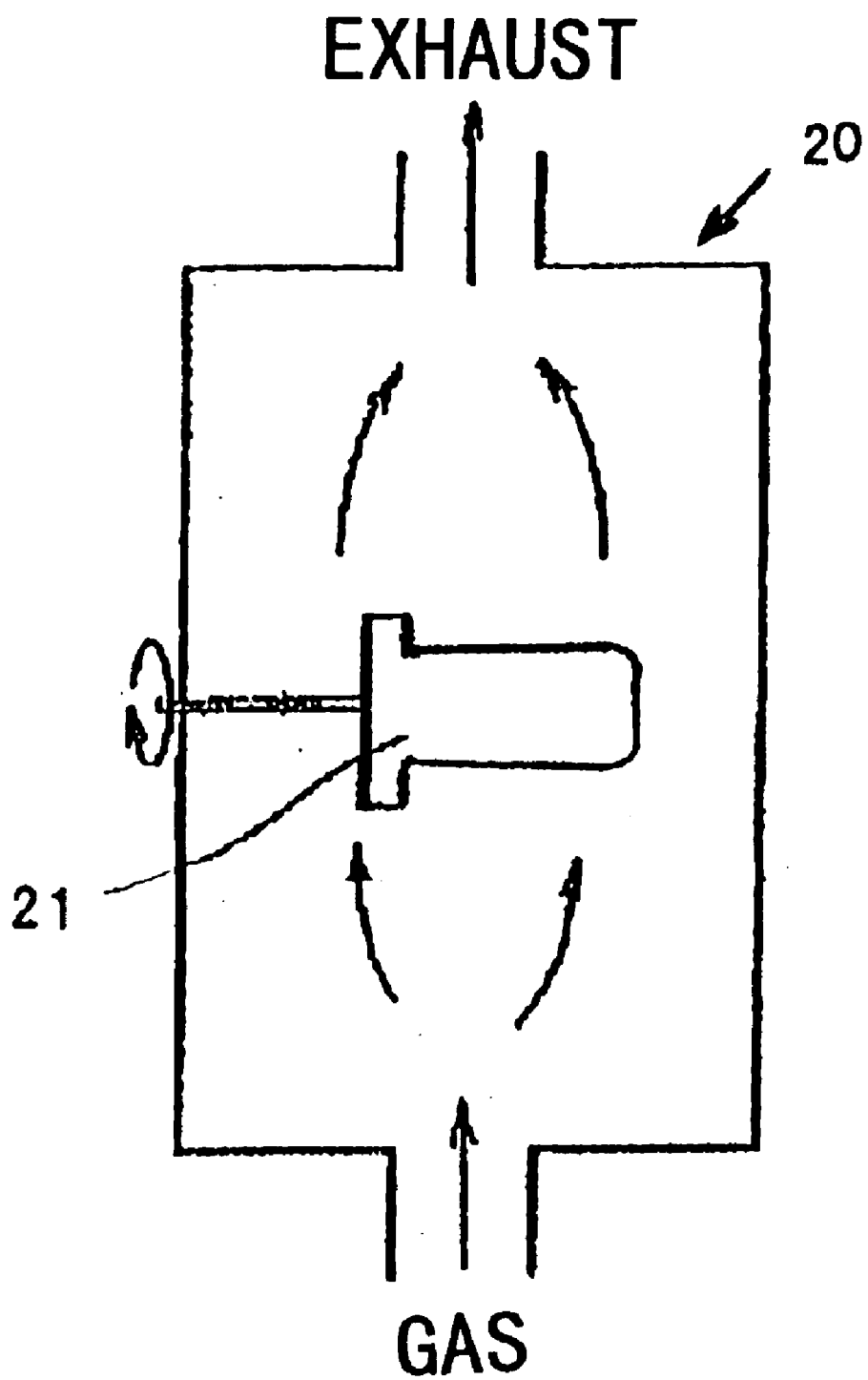
FIG. 2 is a schematic cross-sectional view of a CVD furnace for manufacturing a pyrolytic boron nitride double container used in an MBE method through CVD.

FIG. 2 is a schematic cross-sectional view of a CVD furnace for manufacturing a PBN double container made through CVD according to the present invention.

Example 1

In FIG. 2, firstly, a graphite mandrel 21 in the shape of double container having a flange at the upper opening portion thereof was disposed in a cylindrical graphite CVD furnace 20 and contacted with a reaction gas. Pyrolytic boron nitride was deposited on the mandrel while rotating the thus-disposed mandrel by a CVD reaction, until a desired thickness is obtained.

In the CVD reaction, boron trichloride and ammonium were supplied to the CVD furnace 20 at 2 l/min and 5 l/min, respectively, and reacted at a temperature of 1900° C. under a mean pressure of 4 Torr at the center of the furnace, whereby a PBN container having a flange at the upper opening portion thereof and having a thickness of 0.8 mm, an upper opening diameter of 20 mm, and a height of 40 mm was manufactured. After the reaction, the PBN container was separated from the mandrel. The PBN container was then machined to obtain an inner container. Subsequently, by using a graphite mandrel of which diameter and height are increased respectively by 5 mm as compared with the mandrel used for manufacturing the inner container, the reaction was performed, similar to the inner container, and the container was machined to form an outer container. Then the inner container was put upon the outer container, so that a PBN double container was manufactured. The gap between the inner container and the outer container of this double container was set to 1.7 mm in the radial direction, and 5.0 mm at the bottom portion.

The transmissivity of thus-obtained PBN double container with respect to light having a wave number of 2600 $cm^{-1}$ to 6500 $cm^{-1}$ was measured through use of an IR spectrometer (FTIR-710, product of NICOLET Corp.).

Next, the outer surface of only inner container of the PBN double container was sanded with #320 alumina sandpaper. Each transmissivity of the thus-sanded PBN inner container and the non-sanded outer container with respect to light of 4800 $cm^{-1}$ was measured. Table 1 shows the results of the measurement.

Aluminium was put into the double crucible formed by a combination of the above inner container and outer container, melted in a molecular beam generating apparatus in an MBE growth system which was maintained at ultra-low vacuum, and kept at the temperature of 1100° C. Electric power consumption at this time is also shown in Table 1.

Example 2

Next, the CVD reaction was performed under the same condition and manner as in the above-mentioned Example 1, an inner container of the double container was formed on the mandrel, and then supply of a source gas was stopped. Subsequently, the temperature of the CVD furnace was decreased to 1600° C. under a reduced pressure of 1 Torr. Methane gas, boron trichloride, and ammonium were supplied to the furnace at 5 SLM, 2 /lmin and 5 l/min, respectively, so that a carbon-doped layer was formed over the surface of the PBN container. The carbon-doped PBN container was taken out of the furnace after having been cooled.

The transmissivity of the PBN double container having carbon-doped layer with respect to light of 4,800 $cm^{-1}$ was measured. The results of the measurement are also shown in Table 1.

Further, similar to Example 1, aluminium was put into the double container, melted in the molecular beam generating apparatus in the MBE growth system which was maintained at ultra-low vacuum, and kept at the temperature of 1100° C. Electric power consumption at this time is also shown in Table 1.

As is evident from the results shown in Table 1, in the inner container of the double container of Example 2 in which pyrolytic boron nitride is doped with carbon, carbon elements absorb radiant light. As a result, the transmissivity of the inner container becomes very low. If this container is used as the inner container of the double container, a larger amount of radiant light is absorbed into the inner container, and thus the temperature of the inner container is prevented from decreasing, so that heat efficiency becomes high and molecular beams can be stabilized.

Example 3

Next, a PBN container was manufactured under the same condition and manner as in the above-mentioned Example 1. However, the CVD reaction was performed such that the depositing time of pyrolytic boron nitride in the outer container would be half of that in the inner container, with the result that the thickness of the outer container was set to 0.4 mm.

The transmissivity of the PBN double container composed of two containers which are different in thickness with respect to light of 4,800 $cm^{-1}$ was measured. The results of the measurement are also shown in Table 1.

Further, similar to Example 1, aluminium was put into the double container, melted in the molecular beam generating apparatus in the MBE growth system which was maintained at ultra-low vacuum, and kept at the temperature of 1100° C. Electric power consumption at this time is also shown in Table 1.

As is evident from the results shown in Table 1, the outer container of which thickness is thin does not absorb light. As a result, the transmissivity of the outer container becomes very high. If this double container is used, a larger amount of radiant light is absorbed into the inner container, and thus the temperature of the inner container is prevented from decreasing, so that heat efficiency becomes high and molecular beams can be stabilized.

COMPARATIVE EXAMPLE 1

Next, in the above-described manufacturing process of Example 1, a double container of which inner container and outer container have the same thicknesses and the same surface conditions was manufactured. The transmissivity of each container of the double container is also shown in Table 1. Aluminium was put into the double container, melted in the molecular beam generating apparatus in the MBE growth system which was maintained at ultra-low vacuum, and kept at the temperature of 1100° C., and electric power consumption at this time is also shown in Table 1.

As is evident from the results shown in Table 1, the electric power consumption of each double container of Examples 1, 2 and 3 is low as compared with Comparative Example 1.

Additionally, in the double containers of Examples 1, 2 and 3, there was not caused an accident such that a material melt is cooled rapidly due to switching off the current and thereby the material melt leaks out of the container.

TABLE 1

|  |  | Example 1 | Example 2 | Example 3 | Comparative Example 1 |
|---|---|---|---|---|---|
| Inner container | Thickness (mm) | 0.8 | 0.8 | 0.8 | 0.8 |
|  | Transmissivity (%) | 6 | 3 | 9 | 9 |
| Outer container | Thickness (mm) | 0.8 | 0.8 | 0.4 | 0.8 |
|  | Transmissivity (%) | 9 | 9 | 30 | 9 |
| Transmissivity of Inner container/ Transmissivity of Outer container × 100 (%) |  | 67 | 33 | 30 | 100 |
| Electric Power Consumption (1100° C.) |  | 100 W | 80 W | 85 W | 120 W |

The present invention is not limited to the above-described embodiment. The above-described embodiment is a mere example, and those having the substantially same structure as that described in the appended claims and providing the similar action and effects are included in the scope of the present invention.

For example, in the previous description, the three methods were mentioned as methods for setting the transmissivity of the inner container of the double container with respect to light having a wave number of 2600 $cm^{-1}$ to 6500 $cm^{-1}$ to being 90% or less of that of the outer container, and they were individually explained. However, these methods may be carried out simultaneously. In this case, a double container wherein the transmissivity is controlled with higher accuracy can be manufactured. Further, the transmissivity may be controlled by changing the density of pyrolytic boron nitride deposited during a CVD reaction thereof.

What is claimed is:

1. A pyrolytic boron nitride double container having an inner container and an outer container for a source of molecular beams used in molecular beam epitaxy, comprising:

the outer container having an outer container transmissivity with respect to light having a wave number of 2600 $cm^{-1}$ to 6500 $cm^{-1}$ for the entire length of a wall of the outer container, and the inner container having an inner container transmissivity with respect to light having a wave number of 2600 $cm^{-1}$ to 6500 $cm^{-1}$ for the entire length of a wall of the inner container, wherein said inner container transmissivity is 90% or less of said outer container transmissivity.

2. The pyrolytic boron nitride double container according to claim 1, said inner container comprising an inner surface and an outer surface;

wherein said inner container transmissivity is 90% or less of said outer container transmissivity due to roughness of the outer surface.

3. The pyrolytic boron nitride double container according to claim 1, comprising a doped layer comprising at least one element doped into said inner container;

wherein said at least one element is not selected from the group consisting of nitrogen and boron, and wherein said inner container transmissivity is 90% or less of said outer container transmissivity due to at least one of a thickness, an area, and a doping density of said doped layer.

4. The pyrolytic boron nitride double container according to claim 2, comprising a doped layer comprising at least one element doped into said inner container;
   wherein said at least one element is not selected from the group consisting of nitrogen and boron, and
   wherein said inner container transmissivity is 90% or less of said outer container transmissivity due also to at least one of a thickness, an area, and a doping density of said doped layer.

5. The pyrolytic boron nitride double container according to claim 3, wherein said doped layer is located within the inner container, and wherein said doped layer is not located on said inner surface or said outer surface of said inner container.

6. The pyrolytic boron nitride double container according to claim 4, wherein said doped layer is located within the inner container, and wherein said doped layer is not located on said inner surface or on said outer surface of said inner container.

7. The pyrolytic boron nitride double container according to claim 3, wherein said at least one element is selected from the group consisting of Si, C, and Al.

8. The pyrolytic boron nitride double container according to claim 4, wherein said at least one element is selected from the group consisting of Si, C, and Al.

9. The pyrolytic boron nitride double container according to claim 5, wherein said at least one element is selected from the group consisting of Si, C, and Al.

10. The pyrolytic boron nitride double container according to claim 6, wherein said at least one element is selected from the group consisting of Si, C, and Al.

11. The pyrolytic boron nitride double container according to claim 1, wherein said inner container transmissivity is 90% or less of said outer container transmissivity due to an inner container thickness of said inner container being greater than an outer container thickness of said outer container.

12. The pyrolytic boron nitride double container according to claim 2, wherein said inner container transmissivity is 90% or less of said outer container transmissivity due also to an inner container thickness of said inner container being greater than an outer container thickness of said outer container.

13. The pyrolytic boron nitride double container according to claim 1, wherein said inner container comprises a top, open portion and a bottom portion, and wherein said inner container transmissivity varies from said bottom portion to said top, open portion.

14. The pyrolytic boron nitride double container according to claim 2, wherein said inner container comprises a top, open portion and a bottom portion, and wherein said inner container transmissivity varies from said bottom portion to said top, open portion.

15. The pyrolytic boron nitride double container according to claim 13, wherein said inner container transmissivity decreases from said bottom portion to said top, open portion.

16. The pyrolytic boron nitride double container according to claim 14, wherein said inner container transmissivity decreases from said bottom portion to said top, open portion.

17. The pyrolytic boron nitride double container according to claim 13, wherein said inner container transmissivity increases from said bottom portion to said top, open portion.

18. The pyrolytic boron nitride double container according to claim 14, wherein said inner container transmissivity increases from said bottom portion to said top, open portion.

19. The pyrolytic boron nitride double container according to claim 1, comprising a gap between said inner container and said outer container.

20. The pyrolytic boron nitride double container according to claim 2, comprising a gap between said inner container and said outer container.

21. The pyrolytic boron nitride double container according to claim 19, wherein said gap is 0.2 to 30 mm.

22. The pyrolytic boron nitride double container according to claim 20, wherein said gap is 0.2 to 30 mm.

23. The pyrolytic boron nitride double container according to claim 1, wherein said inner container transmissivity is 70% or less of said outer container transmissivity.

24. The pyrolytic boron nitride double container according to claim 1, wherein said inner container comprises pyrolytic boron nitride combined with another material.

25. The pyrolytic boron nitride double container according to claim 1, wherein said inner container comprises pyrolytic boron nitride combined with pyrolytic graphite.

* * * * *